(12) United States Patent
Pan et al.

(10) Patent No.: US 12,217,936 B2
(45) Date of Patent: *Feb. 4, 2025

(54) DC BIAS IN PLASMA PROCESS

(71) Applicant: Taiwan Semiconductor Manufacturing Co., Ltd., Hsinchu (TW)

(72) Inventors: Sheng-Liang Pan, Hsinchu (TW); Bing-Hung Chen, San-Xia Town (TW); Chia-Yang Hung, Kaohsiung (TW); Jyu-Horng Shieh, Hsinchu (TW); Shu-Huei Suen, Jhudong Township (TW); Syun-Ming Jang, Hsinchu (TW); Jack Kuo-Ping Kuo, Pleasanton, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/504,415

(22) Filed: Nov. 8, 2023

(65) Prior Publication Data
US 2024/0071722 A1 Feb. 29, 2024

Related U.S. Application Data

(63) Continuation of application No. 17/869,557, filed on Jul. 20, 2022, now Pat. No. 11,854,766, which is a
(Continued)

(51) Int. Cl.
H01L 21/02 (2006.01)
H01J 37/32 (2006.01)
(Continued)

(52) U.S. Cl.
CPC .. *H01J 37/32027* (2013.01); *H01J 37/32357* (2013.01); *H01J 37/32449* (2013.01); *H01J 37/32715* (2013.01); *H01L 21/02063* (2013.01); *H01L 21/0212* (2013.01); *H01L 21/02233* (2013.01); *H01L 21/02238* (2013.01); *H01L 21/02252* (2013.01); *H01L 21/31138* (2013.01); *H01L 21/321* (2013.01); *H01J 2237/3341* (2013.01)

(58) Field of Classification Search
None
See application file for complete search history.

(56) References Cited

U.S. PATENT DOCUMENTS 5,827,435 A * 10/1998 Samukawa ....... H01J 37/32192
257/E21.252
5,928,528 A * 7/1999 Kubota ............. H01J 37/32706
257/E21.252

(Continued)

*Primary Examiner* — Jose I Hernandez-Kenney
(74) *Attorney, Agent, or Firm* — Slater Matsil, LLP (57) ABSTRACT

Embodiments described herein relate to plasma processes. A plasma process includes generating a plasma containing negatively charged oxygen ions. A substrate is exposed to the plasma. The substrate is disposed on a pedestal while being exposed to the plasma. While exposing the substrate to the plasma, a negative direct current (DC) bias voltage is applied to the pedestal to repel the negatively charged oxygen ions from the substrate.

19 Claims, 9 Drawing Sheets

Related U.S. Application Data continuation of application No. 16/177,530, filed on Nov. 1, 2018, now Pat. No. 11,404,245.

(60) Provisional application No. 62/636,669, filed on Feb. 28, 2018.

(51) Int. Cl.
*H01L 21/311* (2006.01)
*H01L 21/321* (2006.01)

(56) References Cited

U.S. PATENT DOCUMENTS

| | | | |
|---|---|---|---|
| 6,140,243 A * | 10/2000 | Wallace | H01L 21/02063 438/720 |
| 6,417,080 B1 | 7/2002 | Yokoshima | |
| 6,766,170 B1 | 7/2004 | Aretz et al. | |
| 6,776,170 B2 * | 8/2004 | Liu | H01J 37/32733 134/1.1 |
| 6,805,139 B1 * | 10/2004 | Savas | G03F 7/427 134/1.1 |
| 7,049,209 B1 | 5/2006 | Dalton et al. | |
| 11,404,245 B2 | 8/2022 | Pan et al. | |
| 2003/0162397 A1 * | 8/2003 | Higuchi | H01L 21/76804 257/E21.252 |
| 2005/0191852 A1 | 9/2005 | Takigawa et al. | |
| 2006/0099785 A1 | 5/2006 | Fuller et al. | |
| 2008/0179291 A1 | 7/2008 | Collins et al. | |
| 2010/0206846 A1 * | 8/2010 | Nishimura | H01L 21/02063 156/345.48 |
| 2015/0083582 A1 * | 3/2015 | Dhindsa | H01L 21/67069 204/298.35 |
| 2016/0293386 A1 | 10/2016 | Chen et al. | |
| 2017/0345666 A1 | 11/2017 | Morikita et al. | |

* cited by examiner

DC BIAS IN PLASMA PROCESS

CROSS-REFERENCE TO RELATED APPLICATION & PRIORITY CLAIM

This application is a continuation of U.S. patent application Ser. No. 17/869,557, filed Jul. 20, 2022, which is a continuation of U.S. patent application Ser. No. 16/177,530, filed Nov. 1, 2018, now U.S. Pat. No. 11,404,245, issued Aug. 2, 2022, which claims the benefit of and priority to U.S. Provisional Patent Application No. 62/636,669, filed Feb. 28, 2018, each is incorporated by reference herein in its entirety for all purposes.

BACKGROUND

Plasma processing has become ubiquitous in semiconductor processing. A plasma can have various effects on gases used in processing to achieve advantageous results. For examples, increased energies of a gas used in a plasma can permit processing at lower temperatures. Other benefits can be achieved.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein relate to plasma processes used in semiconductor processing. Embodiments specifically described herein are in the context of using a tunable direct current (DC) bias during a plasma process. A plasma etch process can include flowing a gas, igniting the gas to form a plasma, introducing the plasma in a chamber containing a substrate, and using the tunable DC bias to repel or attract ions to/from the substrate.

Those skilled in the art should recognize that a full process for forming a semiconductor device and the associated structures are not illustrated in the drawings or described herein. Although various operations are illustrated in the drawings and described herein, no limitation regarding the order of such steps or the presence or absence of intervening steps is implied. Operations depicted or described as sequential are, unless explicitly specified, merely done so for purposes of explanation without precluding the possibility that the respective steps are actually performed in concurrent or overlapping manner, at least partially, if not entirely.

Plasma processing can be performed in semiconductor processing. A plasma is an at least partially ionized gas with positive and negative particles including radicals, positively and/or negatively charged ions, and electrons (negatively charged). Some examples of plasma processing include plasma etching and plasma ashing.

Plasma ashing may be the process of removing a photoresist (e.g., a light sensitive coating) from an etched substrate. Using a plasma source, a monatomic (e.g., single atom) substance known as a reactive species can be generated. Some examples of reactive species include oxygen, hydrogen, fluorine, or combinations thereof. The reactive species can be combined with the photoresist to form ash which is removed, e.g., with a vacuum pump. High temperature ashing, or stripping, is performed to remove as much photoresist as possible, while a "descum" process is used to remove residual photo resist in, e.g., trenches. The two processes may use different temperatures that the substrate is exposed to while in the ashing chamber.

Plasma etching is a form of plasma processing that directs a plasma to etch a material. The plasma source uses an etch species of charged ions, radicals, and/or neutral atoms. Elements of the material and the reactive species in the plasma chemically react to etch the material.

While plasma ashing and plasma etching processes use radicals for the ashing or etching, respectively, ions and electrons are also generated. Some plasma processes use a remote plasma in which the plasma source is remote from a location where the plasma and material interaction occurs. Remote plasma tools can diminish energy of downstream (e.g., from the plasma source downstream to the where the material is located, such as the substrate) radicals and ions in the plasma. Some of the ions and electrons can recombine downstream while the radicals survive; however, some ions and electrons remain in the plasma. For example, monatomic oxygen is electrically neutral and, although it does recombine downstream during the channeling, it recombines at a slower rate than the positively or negatively charged free radicals, which attract one another. This means that when all of the free radicals have recombined, there is still a portion of the active species. Thus, after ashing the photoresist, the exposed metal film underneath can become oxidized by the oxygen ions. Hence, the remote plasma process can introduce ions that may penetrate the substrate surface. Surface modification can create halogen induced defects. As geometry sizes of semiconductor devices decrease, the effects of the surface modification can have a great impact on the performance.

Figure 1:
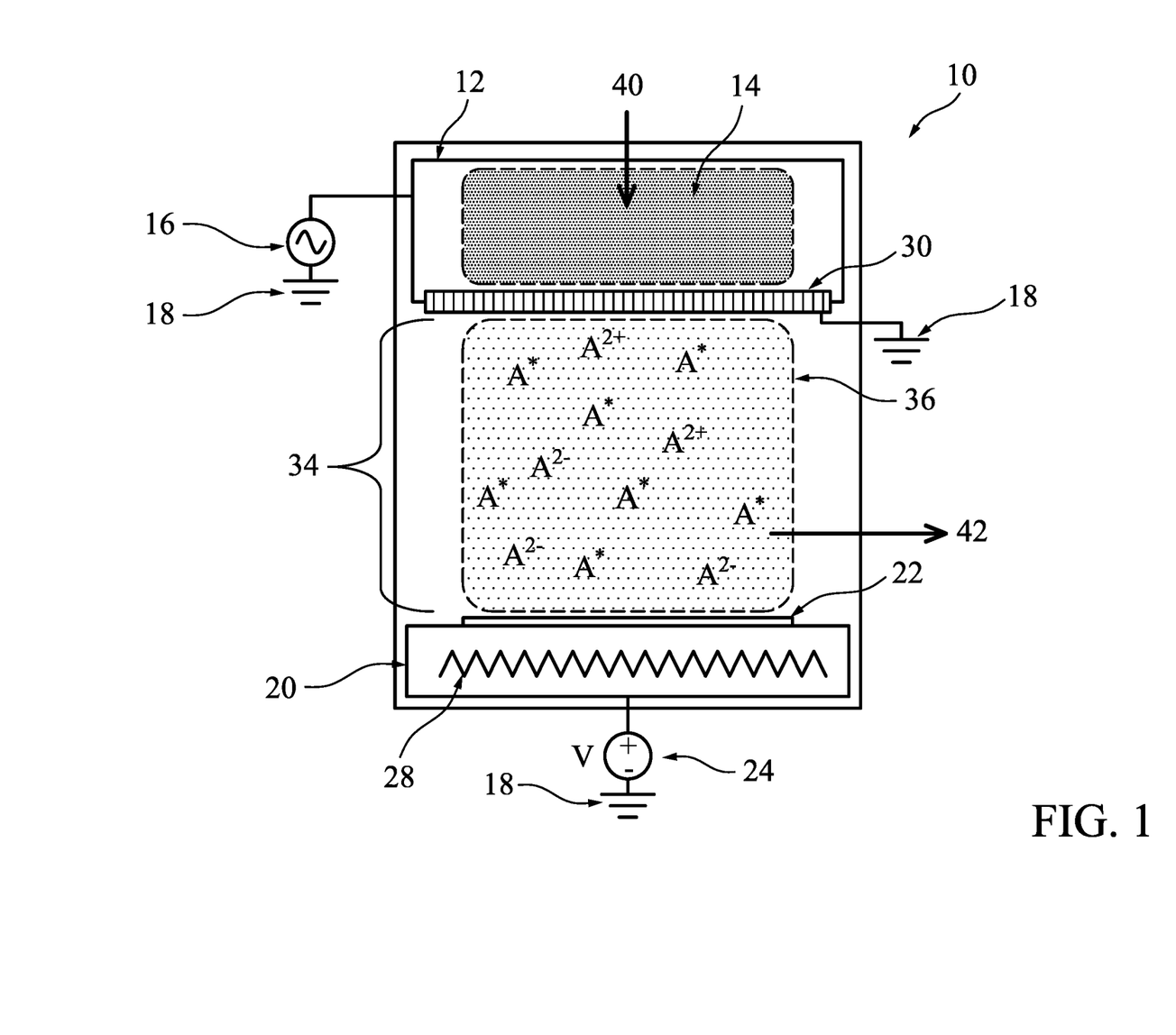
FIG. 1 illustrates a simplified tool, in accordance with some embodiments.

FIG. 1 illustrates a simplified tool 10 in accordance with some embodiments. The tool 10 includes a plasma generator 12. In some examples, the plasma generator 12 is an inductively coupled plasma (ICP) generator or other suitable plasma generator that is operable to generate a remote plasma 14. The remote plasma 14 is remote from the low ion region 36 in which particle interaction occurs. The plasma generator 12 is powered by a power source 16. In some examples, the power source 16 is a radio frequency (RF) power source (e.g., about 13.56 MHz or other suitable RF) or a microwave (MW) power source. The power source 16 is grounded to a ground 18. In some examples, ultra-violet (UV) light (e.g., about 10 nm to 400 nm in wavelength) is generated in the remote plasma 14. For example, the UV light is generated by interactions of the particles in the remote plasma 14, resulting in photon emissions.

The tool 10 includes a pedestal 20 by which a substrate 22 (e.g., a wafer) is supported during processing in the tool 10. In some examples, the substrate 22 is or includes a bulk semiconductor substrate, a semiconductor-on-insulator (SOI) substrate, or the like, that can be doped (e.g., with a p-type or an n-type dopant) or can be undoped. In some embodiments, the semiconductor material of the substrate 22 includes an elemental semiconductor including silicon (Si) or germanium (Ge); a compound semiconductor; an alloy semiconductor; or combinations thereof. Various integrated circuits can be formed on and/or in the substrate 22. The integrated circuits may include, for example, transistors (such as fin field effect transistors (FinFETs), planar FETs, or other transistors) and/or other devices on the substrate, metallizations on the substrate 22 to interconnect devices, etc. The pedestal 20 is electrically coupled to a bias source 24. In some examples, the bias source 24 is a direct current (DC) voltage source that is grounded to the ground 18. In some examples, the bias source 24 is a tunable bias source. In some examples, the bias source 24 is tunable to both negative DC biases and positive DC biases. For example, the bias source 24 is tunable from about −50 V to about +50 V. The DC bias source 24 includes a pulsing function for reducing the loading effect between an isolated and dense pattern. The pulsing function may be an on/off function for the DC bias source. For example, the pulsing function can be a square wave pulse function with any appropriate pulse duration and duty cycle. In some embodiments, the pedestal 20 includes a heating element 28 that is operable to heat the substrate 22 that is being supported by the pedestal 20 during processing in the tool 10. For example, the heating element 28 causes the substrate 22 to be heated at or to a temperature in a range from about 90° C. to about 330° C. In some examples, the pressure may vary based on the particular process. For example, a higher temperature may be used for photoresist stripping due to a higher etch rate, and lower temperature (e.g., less than 100° C.) may be applied after the lithography process to remove the scum of photoresist in the bottom of trench pattern or hole pattern. Lower temperatures may be used in some surface treatment applications to avoid the collapse of small line pattern with high aspect ratio due to temperature induced thermal stress as the wafer is cooled from high temperature to room temperature.

A gas distribution plate (GDP) 30 is disposed in the tool 10 between the plasma generator 12 and the pedestal 20. The GDP 30 is grounded to the ground 18. In some examples, the GDP 30 is an aluminum plate or other suitable material. A gap 34 is between the GDP 30 and the pedestal 20. In some examples, a size of the gap 34 is adjustable. For example, placement of the pedestal 20 relative to the GDP 30 is adjustable to increase or decrease the size of the gap 34. In some examples, a translation mechanism can be mechanically coupled to the pedestal 20 to move the pedestal 20 farther away from or closer to the GDP 30 to increase or decrease the size of the gap 34, respectively. In some examples, the size of the gap 34 between the pedestal 20 and the GDP 30 is in range from about 1 inch to about 3 inches. The GDP 30 distributes a gas, radicals, ions, etc. from the remote plasma 14 into a low ion region 36. For example, the GDP 30 distributes the gas radicals, ions, etc. from the remote plasma 14 uniformly into the low ion region 36. In some examples, the GDP 30 distributes, in the low ion region 36, UV light from the remote plasma 14, and the low ion region 36 may further be a low UV light region. The low ion region 36 may refer to a region having a lower energy relative to the plasma generator 12 region. For example, due to the GDP 30, the UV light and/or the concentration of ions in the low ion region 36 may be lower than in the plasma generator 12. The GDP 30 can have a number (e.g., a plurality) of through-holes. In some examples, the through-holes are of different or various sizes to suppress ions of the remote plasma 14 and/or UV light. Because the GDP 30 is grounded, most UV light is repelled from the surface of the GDP 30.

During processing, a gas 40 is flowed into the plasma generator 12. The gas may be delivered from a gas supply, such as a tank, to the plasma generator 12. In some examples, the gas may be delivered via a pipe or tube, of a suitable material such as steel, from the supply to the plasma generator 12. In some examples, the gas 40 is flowed into the plasma generator 12 at a flow rate in a range from about 200 sccm to about 9000 sccm. In some examples, the flow rate may vary depending on the plasma source and/or the particular process. For example, a lower flow rate may be used for a Toroidal plasma source (e.g., around 400 KHz) in a surface treatment application. A surface treatment application may remove a small amount of material, such as silicon, from a surface, similar to a gentle etch process. On the other hand, a higher flow rate may be used for an ICP plasma source, which may provide improved uniformity of photoresist stripping, or for a surface treatment. The higher flow rate may avoid failure of plasma ignition.

In some examples, the gas 40 includes $O_2$, $N_2$, $H_2$, He, Ar, $CF_4$, $NF_3$, $C_xH_yF_z$, or a mixture of some or all of these gases. In some particular examples, the gas 40 includes $O_2$, $H_2$, or a combination thereof. The gas 40 is ignited in the plasma generator 12 to generate the remote plasma 14. In some examples, the gas 40 is ignited via radio frequency (RF) power (e.g., around 17.56 MHz). In some examples, the gas 40 is ignited by an inductively coupled plasma (ICP) plasma source in which the energy is supplied by electric currents produced by electromagnetic induction using time varying magnetic fields. The remote plasma 14 includes plasma effluents, such as ionized, excited, and/or neutral species of the gas 40. In some examples, UV light is also generated in the remote plasma 14. In some examples, a pressure in the low ion region 36 is in a range from 0.1 Torr to about 4 Torr. In some examples, the pressure may vary depending on the plasma source and/or the particular process. For example, a lower pressure may be used for a Toroidal plasma source in a surface treatment application. On the other hand, a higher pressure may be used for an ICP plasma source, in a photoresist stripping or surface treatment application. The higher pressure may avoid failure of plasma ignition. In some examples, ash rates and uniformity may be correlated to pressure, power, and flow rate. For example, 1 Torr pressure, 5000 W power, and 5000 sccm flow rate may provide high ash rates as compared to lower pressure, power, and/or flow rates.

Ionized, excited, and/or neutral species of the gas 40 from the remote plasma 14 diffuse through the GDP 30 to the low ion region 36, where the substrate 22 is exposed to the ionized, excited, and/or neutral species of the gas 40. In some examples, the ionized, excited, and/or neutral species of the gas 40 and/or other ions removed from the substrate 22 or material on the substrate 22 can be pumped out or removed from the tool 10 by an exhaust 42.

During the exposure of the substrate 22 to the ionized, excited, and/or neutral species of the gas 40, the bias source 24 can bias the pedestal 20 and hence, the substrate 22, with a DC bias voltage, to achieve a desired effect. A polarity of the DC bias voltage, a magnitude of the DC bias voltage, a pulsing function (e.g., including a duty cycle), and/or combinations thereof may result in the desired effect, which can account for a loading effect between an isolated pattern and/or dense pattern. Some examples are described below to illustrate some desired effects.

FIG. 1 as described herein and illustrated in the figures is simplified to not obscure various aspects of the examples described herein. A person having ordinary skill in the art will readily understand various modifications of the simplified tool and/or other features that can be incorporated with the tool.

Figure 2:
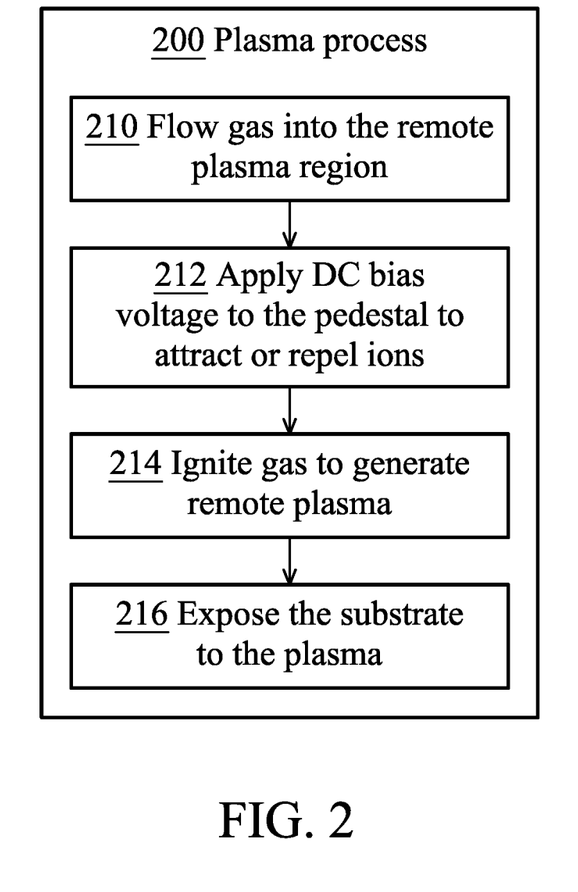
FIG. 2 illustrates an example method for applying a direct current (DC) bias to a pedestal during a plasma process, in accordance with some embodiments.

FIG. 2 is an example method for applying DC bias during a plasma process, for example, to attract or repel ions to/from the substrate 22. The plasma process 200 is a general example of applying a DC bias during plasma processing, which may be performed as a part of a semiconductor device manufacturing process. More specific manufacturing processes and plasma processes are described below, for example, with respect to FIGS. 3, 5, 7, and 9. In block 210, a gas is flowed into a remote plasma region of the tool 10 as the gas 40. In some examples, the gas 40 is flowed into the plasma generator 12 at a flow rate in a range from about 200 sccm to about 9000 sccm. Various gases can be flowed depending on the plasma process being performed. As described in more detail below with respect to FIGS. 3 and 4, the gas 40 could be oxygen for an oxidation process. As described in more detail below with respect to FIGS. 3 through 9, the gas 40 could be oxygen, hydrogen, or a combination thereof, for a plasma ashing process. In some examples, the gas 40 is a fluorine-containing gas for a plasma etch process. Other gases or plasma processes can also be performed.

In block 212, the pedestal 20 is biased with a DC bias voltage. For example, the bias source 24 is tunable from about −50 V to about +50 V. As described in further detail below, the DC bias voltage is applied to attract or repel ions to/from the substrate 22. For example, the DC bias can be applied to oxidize, antioxidate, or defluorinate the substrate 22. In some examples, the DC bias voltage is tunable, for example, to provide a stronger or weaker attraction or repulsion of the ions and/or to switch from a negative DC bias voltage to a positive DC bias voltage, or from a positive DC bias voltage to a negative DC bias voltage.

In block 214, the gas 40 is ignited to generate the remote plasma 14. The gas 40 can be ignited before the pedestal 20 is biased with the DC bias voltage in block 212, after the pedestal 20 is biased with the DC bias voltage in block 212, or at the same time that the pedestal 20 is biased with the DC bias voltage in block 212. In block 216, the remote plasma 14 is then introduced to expose the substrate 22 to the plasma. For example, the remote plasma 14 is diffused through the GDP 30 to the low ion region 36 where the substrate 22 is exposed. In some examples, a pressure in the low ion region 36 is in a range from 0.1 Torr to about 4 Torr. In some examples, the heating element 28 causes the substrate 22 to be heated at or to a temperature in a range from about 90° C. to about 330° C.

Figure 3:
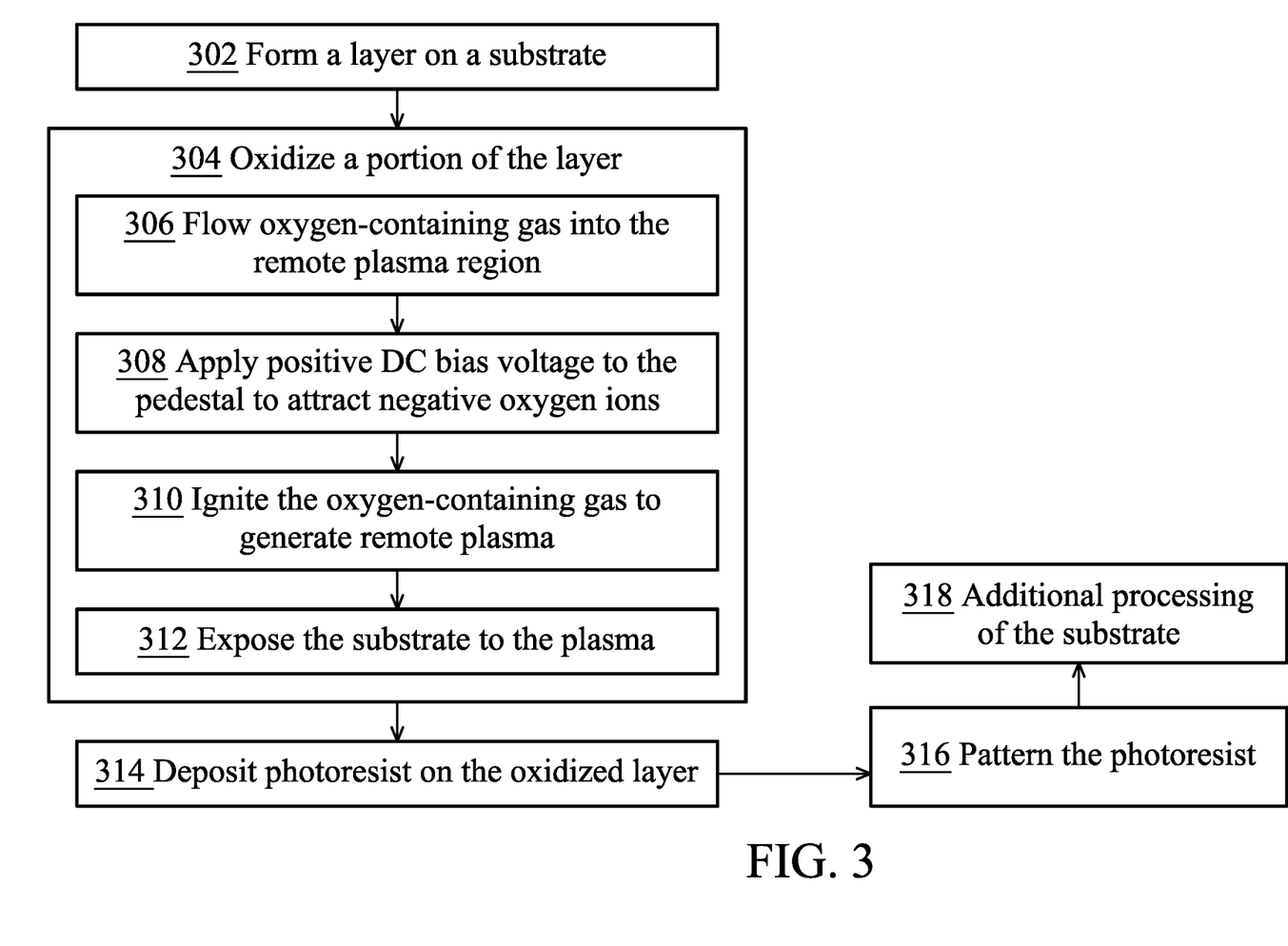
FIG. 3 is an example method for oxidizing a material on a substrate, in accordance with some embodiments.

In a first example of the method for applying DC bias during a plasma process, a remote plasma process is implemented to oxidize a material of the substrate 22. FIG. 3 is an example of the method for oxidizing a material on the substrate 22. In block 302, a layer is formed on a substrate 22. In block 304, a process is formed to oxidize at least a portion of the layer. In other examples, the substrate 22 may be oxidized, for example, without first forming the layer at 302. In block 306, an oxygen-containing gas, such as $O_2$, is flowed into a remote plasma region in the tool 10 as the gas 40. In some examples, the oxygen-containing gas is flowed into the plasma generator 12 at a flow rate in a range from about 200 sccm to about 9000 sccm. In block 308, the pedestal 20 is biased with a positive DC bias voltage applied to the pedestal 20 to attract negative oxygen ions. In some examples, the DC bias is tunable. For example, the bias source 24 is tunable from about +1 V to about +50 V. A larger positive bias can be used to form a thicker oxide layer and a smaller positive bias can be used to form a thinner oxide layer. In block 310, the oxygen-containing gas is ignited to form the remote plasma 14. The ignition of the oxygen-containing gas at block 310 to generate the remote plasma 14 can be before the pedestal 20 is biased with the DC bias voltage at block 308, after the pedestal 20 is biased with the DC bias voltage at block 308, or at the same time that the pedestal 20 is biased with the DC bias voltage at block 308. Next, in block 312, the remote plasma 14 is introduced to the substrate 22 to expose the substrate 22 to the plasma. For example, the remote plasma 14 is diffused through the GDP 30 to the low ion region 36 where the substrate 22 is exposed. In some examples, a pressure in the low ion region 36 is in a range from 0.1 Torr to about 4 Torr. In some examples, the heating element 28 causes the substrate 22 to be heated at or to a temperature in a range from about 90° C. to about 330° C. For example, for an oxidation process, temperatures higher than 200° C. may be preferred.

Further processing steps may be included in the manufacturing process of the semiconductor device. In block 314, a photoresist may be deposited on the oxidized layer. In block 316, the photoresist is patterned. The patterning may depend on the lithography process and type of photoresist being used. The patterning may include masking and exposure to light for example. In block 318, additional processing of the substrate 22 may be performed, such as an etch process using the patterned photoresist.

Figure 4:
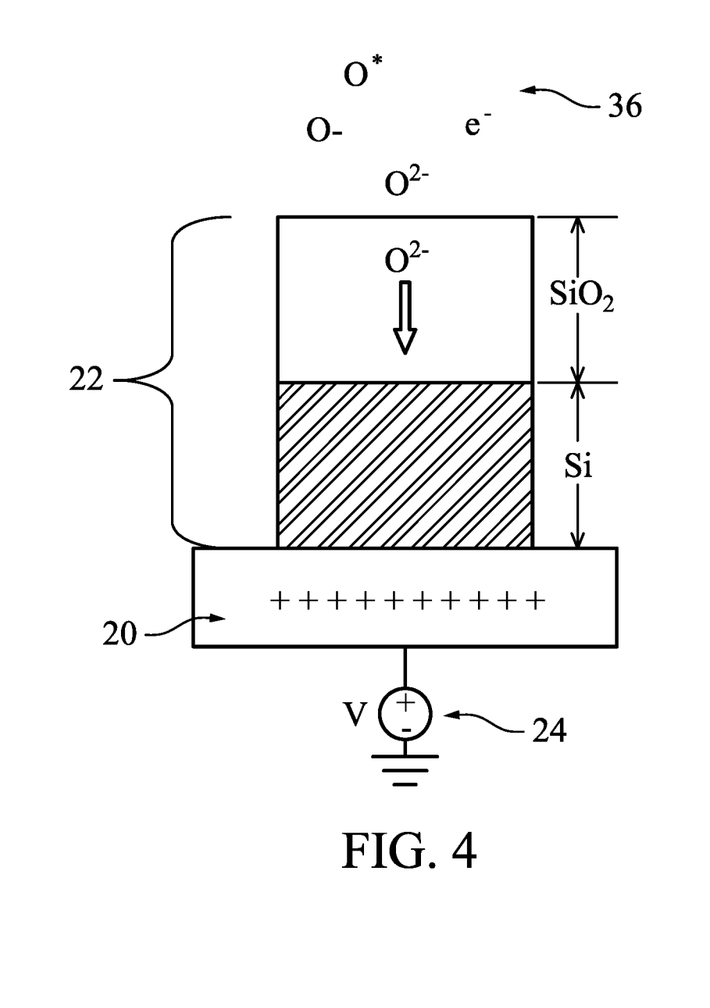
FIG. 4 illustrates the oxidation mechanism for silicon (Si) to form silicon oxide ($SiO_2$), in accordance with some embodiments.

FIG. 4 illustrates the oxidation mechanism for silicon (Si) to form silicon oxide ($SiO_2$) as an example. In other examples silicon germanium (SiGe) or other materials can be oxidized with the process of FIG. 3. Oxidation mechanisms include thermal oxidation and plasma oxidation. Thermal oxidation can involve a high activity energy (e.g., around 2 eV) and a neutral oxygen species. Plasma oxidation can involve a low activation energy (e.g., around 0.15 eV) and negative oxygen ions. The remote plasma generated by igniting the oxygen-containing gas at block 310 contains negative oxygen ions (e.g., $O^{2-}$ and $O^-$). The negative oxygen ions then become exposed to the substrate 22 in the low ion region 36. The positive DC bias voltage from the bias source 24 that is applied at block 308 causes a positive electrical charge to accumulate on the pedestal 20 at the surface that supports the substrate 22. The positive electrical charge on the surface of the pedestal 20 can cause a positive charge to accumulate on the surface of the substrate 22 distal from the pedestal 20. Because the oxygen ions are negatively charged and the surface of the substrate 22 distal from the pedestal 20 is positively charged, an electrostatic force (e.g., attraction) exists between the negative oxygen ions and the substrate 22. The electrostatic force (e.g., attraction) between the negative oxygen ions and the positive charge on the pedestal 20 can cause the oxygen ions to penetrate into the substrate 22, which permits the oxygen ions to react with a material, e.g., silicon, of the substrate 22 to oxidize the material. A larger positive DC bias voltage and/or larger duty cycle can result in a higher oxidation rate, more oxidation, and a thicker oxide layer. In some examples, more oxidation is implemented, such as for a nitride film oxidation, to improve photoresist adhesion and profile, control fin width, increase metal oxidation of isolation, etc. In some examples, the rate of oxidation is a function of the oxygen flow rate, the amplitude of the positive DC bias applied, a duration of the process, electron density in the plasma, and/or other factors such as temperature. In some examples, the DC bias voltage is applied to control a uniformity of the oxidation of the substrate 22 material.

Figure 5:
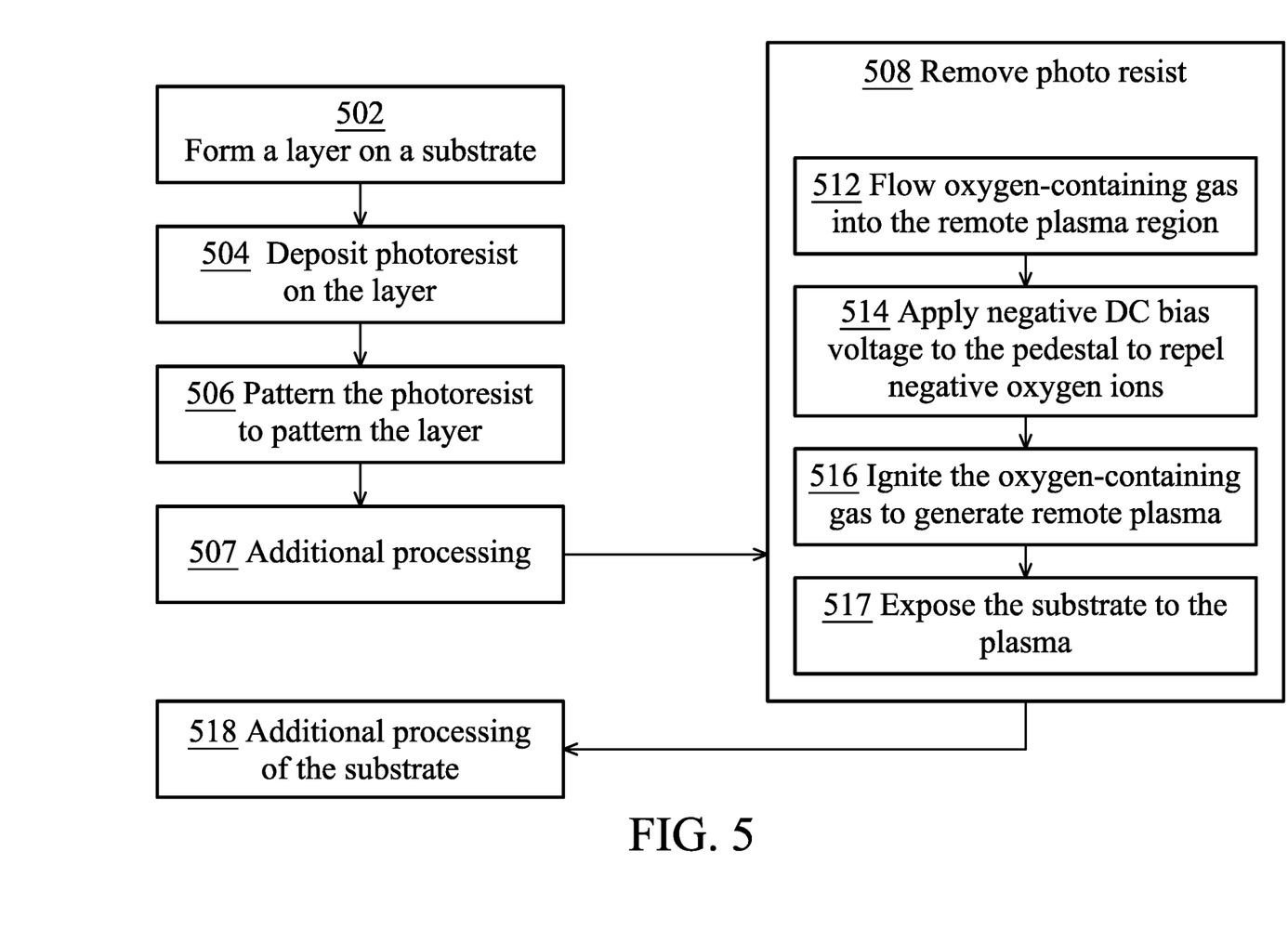
FIG. 5 is an example method for reducing or preventing oxidization of a material of a substrate during a plasma process, in accordance with some embodiments.

In a second example of the method for applying DC bias during a plasma process, a remote plasma process can be implemented to reduce or prevent oxidization of a material of the substrate, such as during an ashing process. FIG. 5 is an example method for reducing or preventing oxidization of a material of the substrate during a plasma process. In block 502 a layer may be formed on a substrate, such as the substrate 22. In block 504, a photoresist may be deposited on the layer. In block 506, the photoresist is patterned. In some examples, the photoresist may be deposited on the substrate 22, for example, rather than forming the layer in block 502. In block 507, additional processing may be performed after patterning the photoresist, for example, an etch process could be performed. In block 508, a process is performed to remove the photoresist, including the blocks 512-517. In block 512, an oxygen-containing gas (and/or a nitrogen-containing gas), such as $O_2$, is flowed into a remote plasma region of the tool 10 as the gas 40. In some examples, the oxygen-containing gas is flowed into the plasma generator 12 at a flow rate in a range from about 200 sccm to about 9000 sccm. The oxygen-containing gas can be used in an ashing process to remove various layers, such as the photoresist or a bi-layer or tri-layer structure used for patterning the deposited layer and/or substrate 22. In block 514, the pedestal 20 is biased with a negative DC bias voltage to repel the negative oxygen ions. In block 516, the oxygen-containing gas is ignited to generate the remote plasma 14 for the plasma process. In some examples, the DC bias voltage is tunable. For example, the bias source 24 is tunable from about −1 V to about −50 V. A larger negative DC bias can be used to further reduce or eliminate oxidation during the plasma process. The ignition of the oxygen-containing gas at block 516 to generate the remote plasma 14 can be before the pedestal 20 is biased with the negative DC bias voltage at block 514, after the pedestal 20 is biased with the negative DC bias voltage at block 514, or at the same time that the pedestal 20 is biased with the negative DC bias voltage at block 514. Next, in block 517, the remote plasma 14 is introduced to the substrate 22 to expose the substrate 22 to the plasma. For example, the remote plasma 14 is diffused through the GDP 30 to the low ion region 36 where the substrate 22 is exposed. In some examples, a pressure in the low ion region 36 is in a range from 0.1 Torr to about 4 Torr. In some examples, the heating element 28 causes the substrate 22 to be heated at or to a temperature in a range from about 90° C. to about 330° C. In a process to remove photoresist, a higher temperature (e.g., higher than 200° C.) may be used for a higher ash rate; but, the higher temperature may increase oxidation and, in turn, substrate loss. However, by using the negative DC bias to repel oxygen ions, the higher ash rate can still be achieved without increased oxidation. In block 518, additional processing may be performed, such as depositing additional layers or material and etching.

Figure 6:
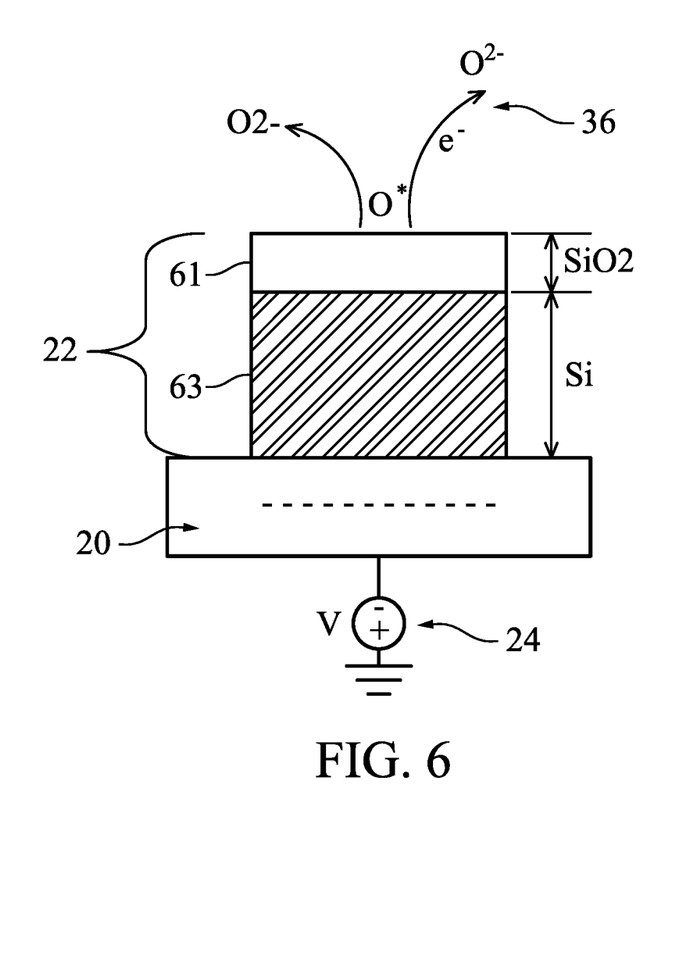
FIG. 6 illustrates the mechanism for reducing or preventing oxidation of silicon (Si), in accordance with some embodiments.

FIG. 6 illustrates the mechanism for reducing or preventing oxidation (e.g., antioxidation) of silicon (Si) as an example. The remote plasma 14 contains negative oxygen ions (e.g., $O^{2-}$ and $O^-$) that then become exposed to the substrate 22 in the low ion region 36. If the oxygen ions penetrate the silicon layer 63 of the substrate 22, the silicon layer 63 can oxidize to form the $SiO_2$ layer 61. The negative DC bias voltage from the bias source 24 causes a negative electrical charge to accumulate on the pedestal 20 at the surface that supports the substrate 22. The negative electrical charge on the surface of the pedestal 20 can cause a negative charge to accumulate on the surface of the substrate 22 distal from the pedestal 20. An electrostatic force (e.g., repulsive) is created by the negatively charged oxygen ions and the negative charge accumulated on the surface of the substrate 22 distal from the pedestal. The electrostatic force (e.g., repulsive) between the negative oxygen ions and the negative charge on the surface of the substrate 22 distal from pedestal 20 can cause the oxygen ions to be repelled from the substrate 22 to thereby reduce or prevent the oxygen ions from penetrating or coming into contact with a material, e.g., silicon layer 63, of the substrate 22, which can reduce or prevent oxidization of the material. Substrate loss can thereby be mitigated. Thus, the ashing process shown in FIG. 5 can simultaneously achieve both ashing of the photoresist with the remaining radicals (O*) and antioxidation of the material of the substrate 22 by repelling the negative oxygen ions (e.g., $O^{2-}$ and $O^-$).

In some examples, the oxygen ashing process and the oxidation process are performed sequentially. For example, the oxygen ashing process as described with respect to FIGS. 5 and 6 can be performed to strip a photoresist from the substrate 22 using the negative DC bias voltage to prevent or reduce oxidation during the ashing process. Next, the positive DC bias voltage could be applied to perform the oxidation process as described with respect to FIGS. 3 and 4 if an oxide layer is desired.

In a third example of the method for applying DC bias during a plasma process, a remote plasma process can be implemented to reduce fluorination (e.g., defluorinate) of a material of the substrate, such as during an ashing process. In some examples, fluorination of the material occurs during a process prior to the ashing process and can be removed during the ashing process. In some examples, the fluorination of the material occurs during an etch process. For example, an etching process can implement fluorine-based gases and plasmas. In those examples, negative fluorine ions can penetrate (e.g., diffuse into) a material of the substrate 22 causing fluorination of the material, which can cause defects. For example, presence of fluorine in the material of the substrate 22 can induce outgassing in subsequent processing of the substrate 22. The outgassing can lead to defects such as condensation defects, film voids, and/or fluorinated pads leading to corrosion of the pad. In some examples, after such an etch process, an ashing process and/or an additional treatment process implementing a remote plasma is performed. As described in FIG. 7, the plasma process can be implemented to reduce the fluorination of the material.

Figure 7:
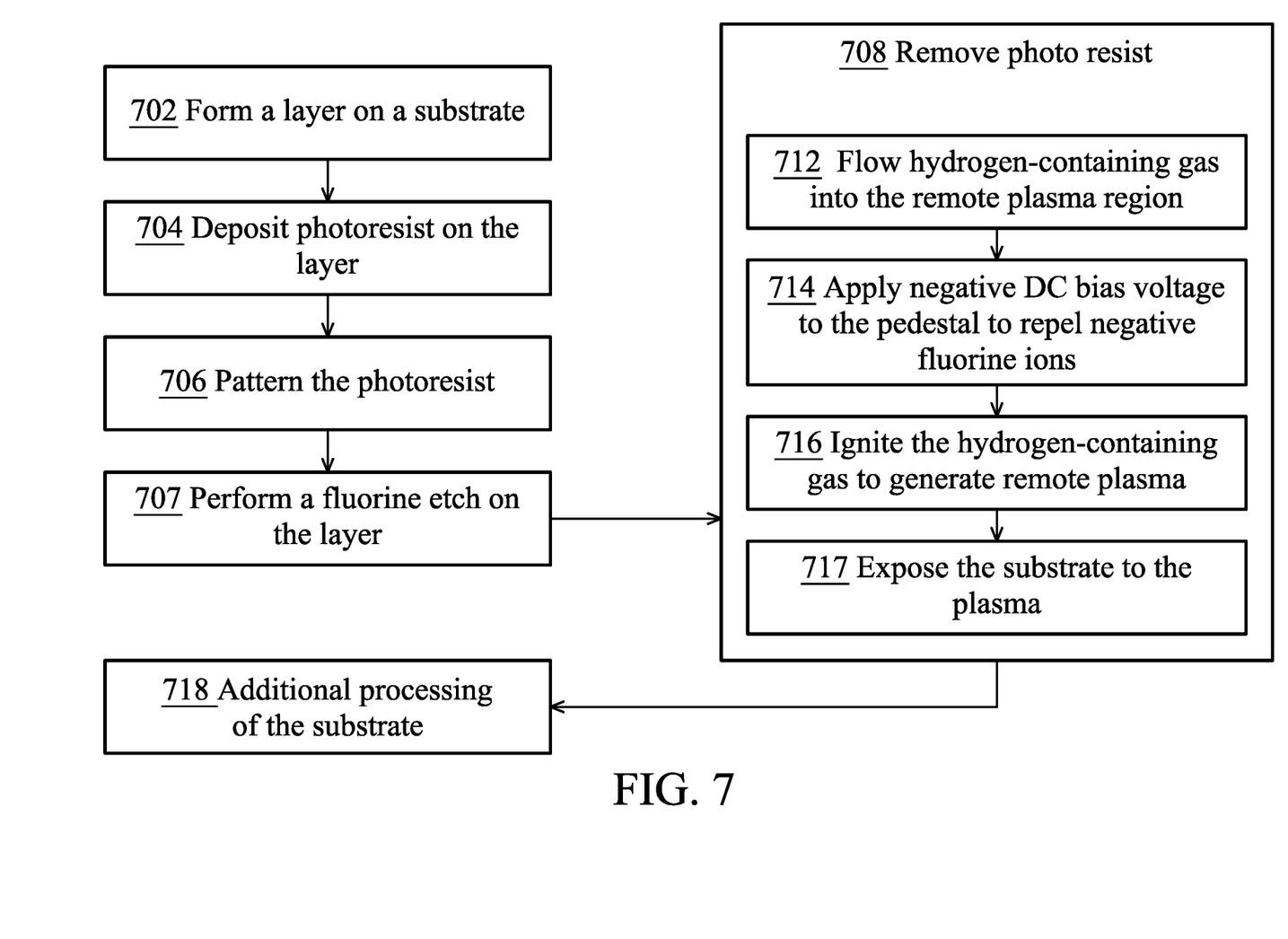
FIG. 7 is an example method for reducing fluorination of a material of a substrate during a plasma process, in accordance with some embodiments.

FIG. 7 is an example method for reducing fluorination of a material of the substrate during a plasma process. The manufacturing process illustrated in FIG. 7 involves a process that uses fluorine, such as an etch process prior to the ashing process. As shown in FIG. 7, in block 702 a layer may be formed on a substrate, such as the substrate 22. In block 704, a photoresist may be deposited on the layer. In block 706, the photoresist is patterned. In some examples, the photoresist may be deposited on the substrate 22, for example, rather than forming the layer in block 702. Additional processing may be performed after patterning the photoresist, for example, in block 707 a fluorine etch process is performed on the layer. In block 708, a process is performed to remove the photoresist, including the blocks 712-717. In block 712, a hydrogen-containing gas, such as $H_2$, is flowed into a remote plasma region in the tool 10 as the gas 40. In some examples, the hydrogen-containing gas (and sometimes also a nitrogen-containing gas) is flowed into the plasma generator 12 at a flow rate in a range from about 200 sccm to about 9000 sccm. The hydrogen-containing gas can be used in an ashing process to remove various layers, such as the photoresist or a bi-layer or tri-layer structure used for patterning the deposited layer and/or substrate 22. In block 714, the pedestal 20 is biased with a negative DC bias voltage to repel negative fluorine ions. In some examples, the DC bias is tunable. For example, the bias source 24 is tunable from about −1 V to about −50 V. A larger negative DC bias voltage can be used to further reduce or eliminate fluoridation during the plasma process. In block 716, the hydrogen-containing gas is ignited to generate the remote plasma 14 for the plasma process. The ignition of the hydrogen-containing gas at block 716 to generate the remote plasma 14 can be before the pedestal 20 is biased with the negative DC bias voltage at block 714, after the pedestal 20 is biased with the negative DC bias voltage at block 714, or at the same time that the pedestal 20 is biased with the negative DC bias voltage at block 714. Next, in block 717, the remote plasma 14 is introduced to the substrate 22 to expose the substrate 22 to the plasma. For example, the remote plasma 14 is diffused through the GDP 30 to the low ion region 36 where the substrate 22 is exposed. In some examples, a pressure in the low ion region 36 is in a range from 0.1 Torr to about 4 Torr. In some examples, the heating element 28 causes the substrate 22 to be heated at or to a temperature in a range from about 90° C. to about 330° C. In a process to remove photoresist, a higher temperature (e.g., higher than 200° C.) may be used for a higher ash rate as well as better removal of the fluorine. In block 718, additional processing may be performed, such as depositing additional layers or material and etching.

Figure 8:
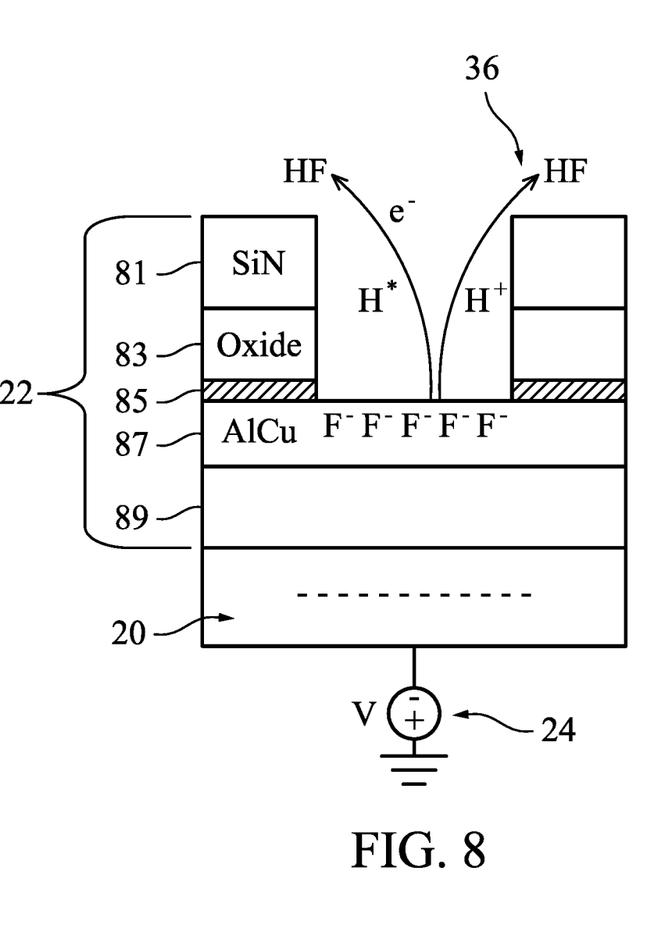
FIG. 8 illustrates the mechanism for reducing fluorination of a metallization (e.g., AlCu) on the substrate, in accordance with some embodiments.

FIG. 8 illustrates the mechanism for reducing fluorination of a material (e.g., a metallization such as AlCu) on the substrate 22 as an example. A bi-layer or tri-layer structure, such as oxide layer 83, SiN layer 81, and hardmask layer 85, is implemented for masking and patterning a metallization (e.g., AlCu) layer 87 and a dielectric layer 89. The patterning uses a fluorine-based plasma that causes negative fluorine ions ($F^-$) to diffuse into the metallization layer 87. The plasma includes positive hydrogen ions (e.g., $H^+$) that then become exposed to the substrate 22 in the low ion region 36. The negative DC bias voltage from the bias source 24 causes a negative electrical charge to accumulate on the pedestal 20 at the surface that supports the substrate 22. An electrostatic force (e.g., repulsive) is created between the negative fluorine ions and the negative charge on the pedestal 20. The electrostatic force between the negative fluorine ions and the negative charge on the pedestal 20 can cause the fluorine ions to be repelled and removed from the substrate 22 to thereby reduce fluorination of the metallization layer 87. An electrostatic force (e.g., attractive) exists between the positive hydrogen ions and the negative fluorine ions. The electrostatic force between the positive hydrogen ions and the negative fluorine ions can also further cause the negative fluorine ions to be removed from the substrate 22 thereby reducing fluorination of the metallization layer 87. The removed fluorine atoms can be attracted to and react with the hydrogen ions to form volatile hydrofluoric acid (HF) (e.g., $F^-+H^+ \rightarrow HF_{gas}$), which can be pumped or exhausted 42 out of the tool 10. Thus, the ashing process shown in FIG. 7 can simultaneously achieve both ashing of the photoresist and defluorination of the material of the substrate 22.

Figure 9:
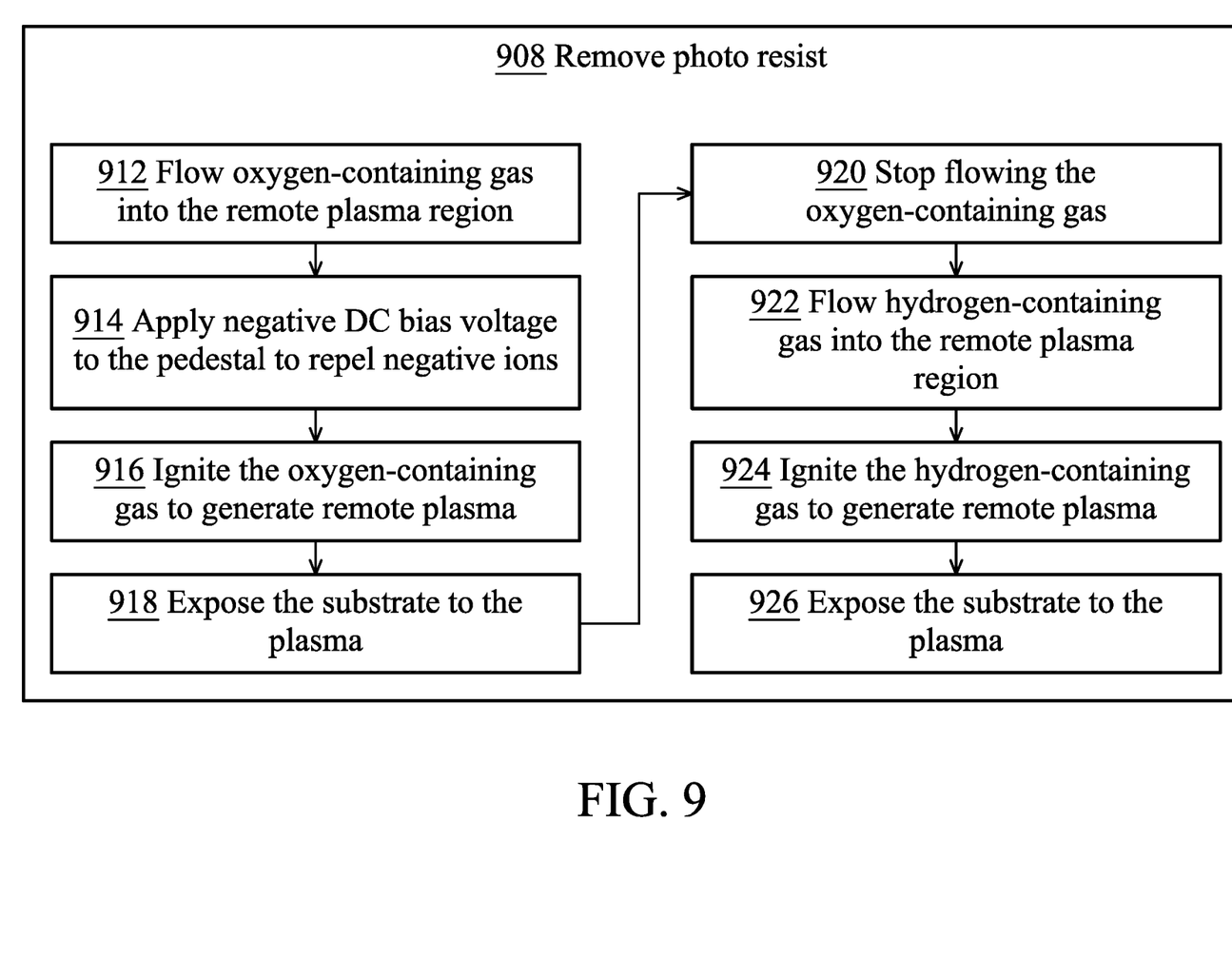
FIG. 9 is an example method for reducing oxidation and fluorination of a material of a substrate during a plasma process, in accordance with some embodiments.

In a fourth example of the method for applying DC bias during a plasma process, a remote plasma process is implemented for anti-oxidizing and de-fluorinating a material of the substrate 22. FIG. 9 is an example method that includes removing a photoresist in block 908 that further reduces oxidization and fluorination of a material on the substrate 22. For example, the plasma process of FIG. 9 can be implemented in the manufacturing process illustrated in FIG. 7 in which a fluorine etch is performed in the process. In block 912, an oxygen-containing gas, such as $O_2$, is flowed into a remote plasma region in the tool 10 as the gas 40. In block 914, the pedestal 20 is biased with a negative DC bias voltage. In block 916, the oxygen-containing gas is ignited to form the remote plasma 14. The ignition of the oxygen-containing gas at block 916 to generate the remote plasma 14 can be before the pedestal 20 is biased with the negative DC bias voltage at block 914, after the pedestal 20 is biased with the negative DC bias voltage at block 914, or at the same time that the pedestal 20 is biased with the negative DC bias voltage at block 914. Next, in block 918, the remote plasma 14 is introduced to the substrate 22 to expose the substrate 22 to the plasma. For example, the remote plasma 14 is diffused through the GDP 30 to the low ion region 36 where the substrate 22 is exposed. The blocks 912-918 can be implemented as an ashing process to remove photoresist from the substrate 22. Use of the negative DC bias during the ashing process reduces or prevents oxidation of the material of the substrate, for example, as described above with respect to FIG. 6 for the example of the mechanism of reducing or preventing oxidation of silicon by repelling the negative oxygen ions.

The method can further be used to defluorinate the substrate 22. For example, prior to the ashing process of FIG. 9, the process 707 using fluorine can be performed, such as a plasma etch process using fluorine. The process using fluorine results in fluorination of a material on the substrate 22, such as a metallization. Thus, in block 920, the method stops flowing the oxygen-containing gas, and in block 922, a hydrogen-containing gas, such as $H_2$, is flowed into a remote plasma region of the tool 10 as the gas 40. In some examples, the pedestal 20 may remain biased with the negative DC bias voltage used during the oxygen ashing in block 914. In some examples, the negative DC bias voltage could be turned off, and is turned back on. In some examples, the negative DC bias voltage can be tuned to a different negative DC bias voltage. For example, a first negative DC bias voltage may be used during the oxygen ashing and a different negative DC bias voltage is used during the defluorination. In block 924, the hydrogen-containing gas is ignited to form a second remote plasma 14. The second remote plasma 14 is then introduced to the substrate 22 to expose the substrate 22 to the plasma in block 926. For example, the second remote plasma 14 is diffused through the GDP 30 to the low ion region 36 where the substrate 22 is exposed. The negative DC bias voltage causes fluorine ions to leave material of the substrate 22, thereby defluorinating the material of the substrate 22, for example, as described above with respect to FIG. 8 for the example of the mechanism of reducing or preventing fluorination of AlCu. Thus, the method of FIG. 9 can provide an efficient technique to achieve simultaneous defluorination and photoresist removal, with minimal oxidation, in a single dry ash process.

In a fifth example of the method for applying DC bias during a plasma process, a remote plasma process is implemented for anti-oxidizing and de-fluorinating a material of the substrate 22. An oxygen-containing gas and hydrogen-containing gas are flowed into the tool 10 as the gas 40 and ignited to form the remote plasma 14. The pedestal 20 is biased with a negative DC bias voltage. The oxygen and/or hydrogen plasma can be used to ash the photoresist, while the negative DC bias voltage applied to the pedestal 20 reduces or prevents oxidation and also cause fluoride to be released. The fluoride can combine with the hydrogen ions and be removed from the tool 10 by the exhaust 42.

The example methods described herein are to illustrate aspects of various embodiments. Embodiments may be implemented in and/or for other processes that would be readily understood by a person having ordinary skill in the art. Further, some aspects of the example methods described above can be implemented together and/or in combination with other features not described herein. For example, an ash process can implement $O_2$ and $H_2$ gas to achieve various benefits described herein. The example methods may also be performed in any logical order, and any order described herein or illustrated in the figures is merely for convenience in describing the examples. Various embodiment methods may be performed in other orders.

Embodiments can have benefits. For example, some embodiments can reduce or avoid oxidation of a substrate during an ashing process. Further, substrate loss from the ashing process can be reduced or avoided. Penetration of halogenic ions into a substrate can be reduced or avoided, which can reduce or avoid defects in the substrate. Some embodiments can reduce or eliminate fluorination of a substrate during an ashing process, which can avoid defects in the substrate. Some embodiments can reduce or avoid oxidation of a substrate and also reduce or eliminate fluorination of the substrate during a single ashing process. Some embodiments can increase oxidation during a plasma process.

In an embodiment, a method is provided. The method includes generating a plasma containing negatively charged oxygen ions. The method includes exposing a substrate to the plasma. The substrate is disposed on a pedestal while being exposed to the plasma. The method includes applying a negative direct current (DC) bias voltage to the pedestal while exposing the substrate to the plasma to repel the negatively charged oxygen ions from the substrate.

In another embodiment, a method is provided. The method includes generating a plasma comprising positively charged hydrogen ions. The method includes exposing a substrate to the plasma. The substrate contains negatively charged fluorine ions and is disposed on a pedestal while being exposed to the plasma. The method includes applying a negative direct current (DC) bias voltage to the pedestal to repel the negatively charged fluorine ions from the substrate while exposing the substrate to the plasma.

In yet another embodiment, a method is provided. The method includes generating a plasma containing negatively charged oxygen ions. The method exposing a substrate to the plasma. The substrate is disposed on a pedestal while being exposed to the plasma. The method includes applying a positive direct current (DC) bias voltage to the pedestal to attract the negatively charged oxygen ions to the substrate while exposing the substrate to the plasma.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   placing a substrate on a pedestal within a chamber, the chamber comprising a first region and a second region separated by a gas distribution plate, the pedestal being disposed within the second region of the chamber, the substrate comprising negatively charged fluorine ions; and
   performing a plasma process on the substrate, performing the plasma process comprises:
   flowing an oxygen-containing gas into the first region;
   generating a first plasma in the first region of the chamber;
   exposing the substrate to the first plasma while applying a first negative direct current (DC) bias voltage;
   stopping the flow of the oxygen-containing gas;
   flowing a hydrogen-containing gas into the first region;
   generating a second plasma in the first region of the chamber;
   exposing the substrate to the second plasma while applying a second negative DC bias voltage; and
   stopping the flow of the hydrogen-containing gas, wherein the first negative DC bias voltage is a same negative DC bias voltage as the second negative DC bias voltage, the same negative DC bias voltage being applied continuously from exposing the substrate to the first plasma to after exposing the substrate to the second plasma.

2. The method of claim 1 wherein applying the first negative DC bias voltage comprises pulsing the first negative DC bias voltage.

3. The method of claim 1 wherein applying the second negative DC bias voltage comprises pulsing the second DC bias voltage.

4. The method of claim 1 further comprising removing hydrofluoric acid from the chamber.

5. The method of claim 1, wherein the substrate is exposed to the first plasma prior to applying the first negative DC bias voltage.

6. The method of claim 1, wherein the pedestal comprises a heating element, and the method further comprises heating the substrate to a temperature in a range from about 90° C. to about 330° C. during the plasma process.

7. The method of claim 1, wherein a pressure in the second region of the chamber is maintained in a range from 0.1 Torr to about 4 Torr during the plasma process.

8. A method comprising:
placing a substrate on a pedestal within a chamber, the chamber comprising a first region and a second region separated by a gas distribution plate, the pedestal being disposed within the second region of the chamber; and
performing a plasma process on the substrate, performing the plasma process comprises:
generating a first plasma in the first region of the chamber, the first plasma comprising negatively charged oxygen ions;
filtering the first plasma by the gas distribution plate into the second region of the chamber to expose the substrate to the negatively charged oxygen ions;
applying a first negative direct current (DC) bias voltage to the pedestal to repel the negatively charged oxygen ions from the substrate;
halting generation of the first plasma;
generating a second plasma in the first region of the chamber, the second plasma comprising positively charged hydrogen ions;
filtering the second plasma by the gas distribution plate into the second region of the chamber to expose the substrate to the positively charged hydrogen ions; and
applying a second negative DC bias voltage to the pedestal to remove at least some negatively charged fluorine ions from the substrate, the first negative DC bias voltage being a same bias voltage as the second negative DC bias voltage, the same bias voltage is applied continuously from applying the first negative DC bias voltage to completing the plasma process.

9. The method of claim 8, wherein the gas distribution plate filters at least some ultra-violet light generated from the first plasma and the second plasma in the first region.

10. The method of claim 8, wherein applying the first negative DC bias voltage comprises pulsing the first negative DC bias voltage.

11. The method of claim 8, wherein applying the second negative DC bias voltage comprises pulsing the second negative DC bias voltage.

12. The method of claim 8, wherein the gas distribution plate comprises a plurality of through-holes of different sizes.

13. The method of claim 8, further comprising adjusting a size of a gap between the gas distribution plate and the pedestal to control distribution of the filtered first plasma and filtered second plasma in the second region.

14. A method comprising:
placing a substrate on a pedestal within a chamber; and
performing a plasma process on the substrate, performing the plasma process comprises:
generating a first plasma, the first plasma comprising negatively charged oxygen ions, the substrate being exposed to the negatively charged oxygen ions;
applying a first negative direct current (DC) bias voltage to the pedestal to repel the negatively charged oxygen ions from the substrate;
generating a second plasma, the second plasma comprising positively charged hydrogen ions, the substrate being exposed to the positively charged hydrogen ions; and
applying a second negative DC bias voltage to the pedestal to remove at least some negatively charged fluorine ions from the substrate, the first negative DC bias voltage being a same bias voltage as the second negative DC bias voltage, the same bias voltage is applied continuously from applying the first negative DC bias voltage to applying the second negative DC bias voltage.

15. The method of claim 14, further comprising, prior to performing the plasma process:
performing an etch process on the substrate, the etch process leaving negatively charged fluorine ions in the substrate.

16. The method of claim 14, further comprising, prior to performing the plasma process:
forming a photoresist layer on the substrate, wherein performing the plasma process removes the photoresist layer.

17. The method of claim 14, further comprising removing hydrofluoric acid from the chamber, wherein the hydrofluoric acid is formed by a reaction between the negatively charged fluorine ions and the positively charged hydrogen ions.

18. The method of claim 14, wherein applying the first negative DC bias voltage and applying the second negative DC bias voltage comprises pulsing a negative DC bias voltage.

19. The method of claim 14, further comprising filtering ultra-violet light from the first plasma and the second plasma to prevent at least some of the ultra-violet light from reaching the substrate.

* * * * *